(12) United States Patent
Kajiwara et al.

(10) Patent No.: US 8,492,202 B2
(45) Date of Patent: Jul. 23, 2013

(54) SEMICONDUCTOR DEVICE AND METHOD OF MANUFACTURING THE SAME

(71) Applicant: Renesas Electronics Corporation, Kawasaki (JP)

(72) Inventors: Ryoichi Kajiwara, Hitachi (JP); Shigehisa Motowaki, Mito (JP); Kazutoshi Ito, Hitachi (JP); Toshiaki Ishii, Hitachi (JP); Katsuo Arai, Takasaki (JP); Takuya Nakajo, Numata (JP); Hidemasa Kagii, Takasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/677,856

(22) Filed: Nov. 15, 2012

(65) Prior Publication Data

US 2013/0071971 A1    Mar. 21, 2013

Related U.S. Application Data

(62) Division of application No. 12/691,175, filed on Jan. 21, 2010, now Pat. No. 8,314,484.

(30) Foreign Application Priority Data

Jan. 23, 2009    (JP) .................................. 2009-013386

(51) Int. Cl.
*H01L 23/15* (2006.01)
(52) U.S. Cl.
USPC .... 438/113; 438/119; 438/660; 257/E21.575; 257/E23.068; 257/705
(58) Field of Classification Search
USPC ................. 438/111, 112, 123, 127, 118, 608, 438/686, 650, 660, 119, 113; 257/741, 705, 257/E21.575, E23.068
See application file for complete search history.

(56) References Cited

U.S. PATENT DOCUMENTS

| 6,852,427 | B1 | 2/2005 | Howell et al. |
| 2003/0020159 | A1 | 1/2003 | Schwarzbauer |
| 2005/0121330 | A1 | 6/2005 | Howell et al. |
| 2008/0145607 | A1 | 6/2008 | Kajiwara et al. |
| 2009/0096100 | A1 | 4/2009 | Kajiwara et al. |

FOREIGN PATENT DOCUMENTS

| JP | 2003525974 | 9/2003 |
| JP | 2007-508448 | 4/2007 |
| JP | 2008-153470 | 7/2008 |
| JP | 2009-94341 | 4/2009 |

OTHER PUBLICATIONS

"A Novel High Performance Adhesion Enhancing Zn-Cr Leadframe Coating for Popcorn Prevention" by Charles Lee, IEEE Transactions on Advanced Packaging, vol. 22, No. 3, Aug. 1999.
Japanese Office Action mailed Jan. 8, 2013 in corresponding Japanese Patent Application No. 2009-013386 with English language translation.

*Primary Examiner* — S. V. Clark
*Assistant Examiner* — Krista Soderholm
(74) *Attorney, Agent, or Firm* — Brundidge & Stanger, P.C.

(57) ABSTRACT

In a structure of a semiconductor device, a Si chip and a metal leadframe are jointed by metallic bond via a porous joint layer made of high conductive metal, having a three-dimensional network structure and using Ag as a bonding material, and a film containing Zn oxide or Al oxide is formed on a surface of a semiconductor assembly contacting to a polymer resin. In this manner, by the joint with the joint layer having the porous structure mainly made of Ag, thermal stress load of the Si chip can be reduced, and fatigue life of the joint layer itself can be improved. Besides, since adhesion of the polymer resin to the film can be enhanced by the anchor effect, occurrence of cracks in a bonding portion can be prevented, so that a highly-reliable Pb-free semiconductor device can be provided.

10 Claims, 7 Drawing Sheets

SEMICONDUCTOR DEVICE AND METHOD OF MANUFACTURING THE SAME

CROSS-REFERENCE TO RELATED APPLICATION

The present application claims priority from Japanese Patent Application No. JP 2009-013386 filed on Jan. 23, 2009, the content of which is hereby incorporated by reference into this application.

TECHNICAL FIELD OF THE INVENTION

The present invention relates to a semiconductor device and a method of manufacturing the same. More particularly, the present invention relates to a technique effectively applied to a semiconductor device having a Pb(lead)-free die-bonding structure requiring electric continuity and heat radiation performance and a method of manufacturing the semiconductor device.

BACKGROUND OF THE INVENTION

In a semiconductor device, such as an IGBT (Insulated Gate Bipolar Transistor) or a power MOSFET (Metal Oxide Semiconductor Field Effect Transistor), on which a vertical semiconductor chip having an electrode on a rear surface of the chip is mounted, high Pb content solder is used for a die-bonding material in order to withstand the 260° C. reflow process in the secondary packaging. Although high Pb content solder is exempted from the regulations prohibiting the use of lead in RoHS instruction which have been enforced since 2007, Pb-free for high Pb content solder has been strongly demanded because of the increase of environment consciousness in recent years.

However, in a structure in which a Cu(copper)-based metal leadframe and a semiconductor chip using a Si (silicon) substrate are die-bonded to each other, difference of thermal expansion between base materials is large, and an alloy-based high-temperature Pb-free solder material capable of withstanding the thermal strain caused by the thermal expansion has not been found yet. As a bonding material having a reflow resistivity at 260° C. other than solder, there are an Ag (silver) paste of a resin adhesion type and a metal bond paste using Ag sintering phenomena. However, the strengths and deformabilities thereof at a joint portion are not so high as those of high Pb content solder, and therefore, their reliabilities under thermal cycle test in the case of using them in a conventional semiconductor device are lower than that of high Pb content solder, and examples where they are used for the products of a high-output semiconductor chip over 10 W have not been reported yet.

Meanwhile, for the higher reliability of a semiconductor device, a manufacturing technique of a semiconductor device for enhancing adhesion between a metal leadframe and molding compounds is known (for example, Japanese Patent Application Publication (Translation of PCT International Application) No. 2007-508448 (Patent Document 1) or IEEE TRANSACTIONS ON ADVANCED PACKAGING, Vol. 22, No. 3, pp. 398 to 406, August 1999, (Non-Patent Document 1)). The manufacturing technique has a mechanism in which an alloy-based film composed of Zn (zinc) and Cr (chromium) or Zn and other metals is formed on a metal surface in an alkaline aqueous solution by an electro-plating method to make a Zn-alloy film with a whisker structure, so that the film is strongly adhered to a polymer resin by mechanical anchor effect. It is said that high-joint strength can be maintained at a joint portion even under environments such as high humidity and cyclic thermal stress and the popcorn phenomena resulting from vapor explosion in a resin-molded semiconductor device can be prevented.

SUMMARY OF THE INVENTION

With respect to a semiconductor device including a vertical semiconductor chip having an electrode on its rear surface, in a method in which an Ag paste or a sintering-type metal bond paste is used for a die-bonding material and adhesion between a metal leadframe and molding compounds is enhanced by an electro-plating method, thereby obtaining high reliability like in a conventional semiconductor device, a bonding portion is dipped into an alkaline aqueous solution of a plating solution. Therefore, there are problems such that joint strength at an interface between the rear-surface electrode and the Ag paste or between the metal leadframe and the Ag paste in the semiconductor chip is decreased by moisture influence at the joint portion of the Ag paste to cause delamination, and that moisture penetrates into the Ag-paste resin and bubbles are formed at an interface between the Ag-paste resin and the molding compounds or inside the molding compounds in a step of molding the molding compounds and heating it to harden. Also, in the case of die-bonding by the sintering-type metal bond paste, since a die-bonding layer has a fine-porous structure, the plating solution penetrating in the joint layer cannot be completely removed in a cleaning step after the plating step. Therefore, residual ionic impurities in the joint layer cause problems such as the decrease of reliability of the semiconductor device against high temperature and high humidity and the decrease of productivity because of requirement of time for the cleaning step and a drying step. Further, in a method of carrying out the plating after filling the porous portion with resin, there is a problem such that moisture of the plating solution penetrates into the resin and bubbles are formed at an interface of the molding compounds or inside the molding compounds in a step of molding the molding compounds and heating it to harden like in the case of the Ag paste.

A preferred aim of the present invention is, in a semiconductor device including a vertical semiconductor chip with an output power of over 5 W, to provide a technique of manufacturing a highly-reliable semiconductor device using a Pb-free Ag-based conductive material for the die-bonding material and having reliability under thermal cycle test equal to or higher than that of a package using a conventional high Pb content solder.

The typical ones of the inventions disclosed in the present application will be briefly described as follows.

In a method of manufacturing a semiconductor device according to an invention of the present application, the semiconductor device includes a semiconductor assembly and insulating molding compounds, the semiconductor assembly including: a metal leadframe having an external-extraction metal lead and a bonding portion; a semiconductor chip die-bonded onto the bonding portion on the metal leadframe via a joint layer and having a rear-surface electrode; and a joint member electrically connecting an electrode formed on a main surface of the semiconductor chip and the external-extraction metal lead, and the insulating molding compounds being formed so as to cover the semiconductor chip and a periphery of the semiconductor chip. Also, the method of manufacturing the semiconductor device includes the steps of: (a) die-bonding the semiconductor chip to the bonding portion on the metal leadframe by a conductive material containing Ag; (b) electrically connecting the electrode on the main surface of the semiconductor chip and the external-extraction metal lead; (c) after the step of (b), coating an organic metal compound solution on the semiconductor assembly; (d) after the step of (c), heating the semiconductor assembly on which the organic metal compound solution is coated, thereby forming a metal oxide film on a surface of the semiconductor assembly by sintering; and (e) molding the insulating molding compounds so as to cover at least a part of the semiconductor chip, the joint member, and the metal leadframe and then performing hardening treatment thereto, wherein the die-bonding step in the step of (a) includes the steps of: supplying, on the metal leadframe, the conductive material containing Ag made of Ag fine particles having a diameter of 1 μm or smaller, an organic material evaporated and disappearing under an oxidizing atmosphere at 300° C. or lower, and conductive metal particles each having a diameter larger than 15 μm and smaller than 150 μm; mounting the semiconductor chip by pushing it from above the conductive material containing Ag; and after the mounting step, heating the semiconductor assembly under an oxidizing atmosphere at a temperature of 150 to 300° C., thereby forming the joint layer.

The effects obtained by typical aspects of the present invention disclosed in the present application will be briefly described below.

There can be provided a Pb-free bonding portion that prevents fatigue failure of a metal portion upon temperature variation in the semiconductor chip by increasing joint strength and bendability of the bonding portion of the semiconductor device and has an equivalent reliability under thermal cycle test to that of a conventional high Pb content solder.

Also, since the joint strength between the metal leadframe and the molding compounds is significantly improved, the state where compression force to the bonding portion is constantly applied by hardening and thermal shrinkage of the resin can be maintained, so that cracks in the joint layer can be prevented even if cyclic thermal stress is applied to the bonding portion by the thermal cycle test and others, and therefore, a Pb-free semiconductor device having significantly-improved reliability can be provided.

BRIEF DESCRIPTIONS OF THE DRAWINGS

DESCRIPTIONS OF THE PREFERRED EMBODIMENTS

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle. Also, when "formed of A" or "formed by A" is described for components or the like in embodiments, it goes without saying that other components are not eliminated unless otherwise specified to be only the component or others.

Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

In addition, when materials and others are mentioned, specified one is a main material unless otherwise stated not to be so or it is principally or apparently not so, and subsidiary components, additives, additional components, and others are not eliminated. For example, a silicon material includes not only pure silicon but also binary or ternary alloy (for example, SiGe) having additive impurities and silicon as a main component or others unless otherwise stated.

Also, components having the same function are denoted by the same reference symbols throughout the drawings for describing the embodiments, and the repetitive description thereof is omitted.

Moreover, in some drawings used in the embodiments, hatching is used even in a plan view so as to make the drawings easy to see.

(First Embodiment)

In the present embodiment, the present invention is applied to a method of manufacturing a semiconductor device, and the first embodiment will be described with reference to FIGS. 1 to 8.

Figure 1:
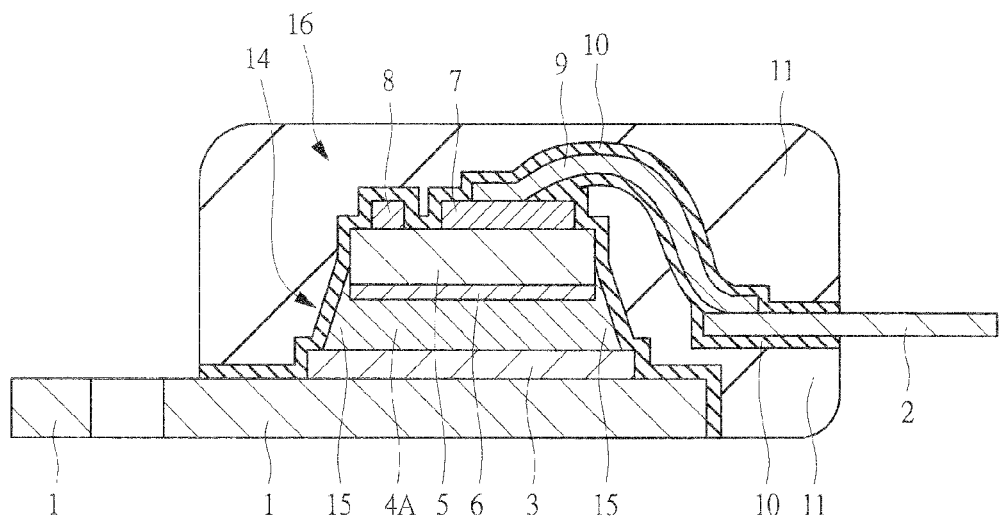
FIG. 1 is a cross-sectional view of a principal part illustrating a semiconductor device according to a first embodiment of the present invention.
Figure 2:
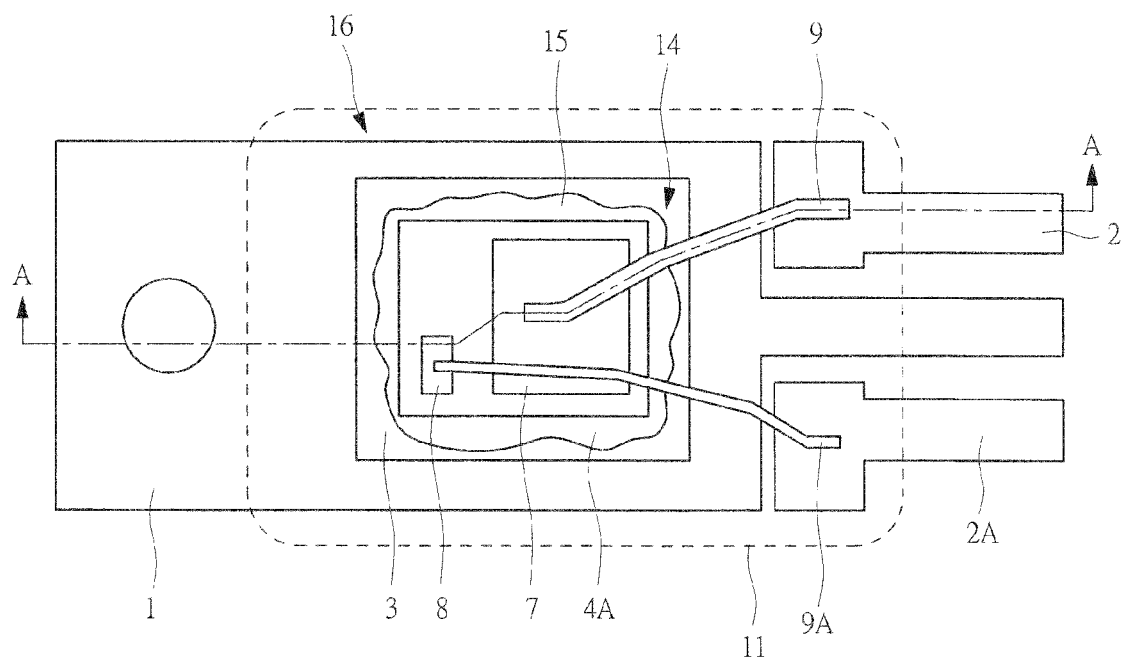
FIG. 2 is a plan view illustrating the semiconductor device according to the first embodiment of the present invention.

FIGS. 1 and 2 illustrate a structure of a semiconductor device according to the present embodiment. FIG. 1 illustrates a cross-sectional view taken along a line A-A in FIG. 2. FIG. 2 is a top-surface plan view of the semiconductor device according to the present embodiment. Note that, in FIG. 2, epoxy molding compounds 11 in FIG. 1 are illustrated by a dash line, and a film 10 is not illustrated.

In FIGS. 1 and 2, a rear-surface electrode 6 made of a metal such as gold is formed on a rear surface of a Si (silicon) chip 5, which is a vertical semiconductor chip having an electrode on its rear surface like an IGBT and a power MOSFET, and a main electrode 7 and a control electrode 8 each formed of an Al (aluminum) film are formed on a main surface of the Si chip 5. An Ag(silver)-plating film 3 is formed on a surface of a chip-mounting position on a metal leadframe 1 to which Ni (nickel) is plated, and the Si chip 5 is die-bonded onto the Ag-plating film 3 via an Ag porous joint layer 4A by metallic bond. A thickness of the joint layer 4A is 60 μm, and porosity of the same is 40%. Al wires 9 and 9A are bonded and wired between the main electrode 7 on the Si chip 5 and an external-extraction metal lead 2 and between the control electrode 8 and a control-electrode metal lead 2A, respectively. On a surface of a semiconductor assembly 16 contacting to the epoxy molding compounds 11, the insulating film 10 containing ZnO (zinc oxide) is formed.

According to the present embodiment, the film 10 containing ZnO and the epoxy molding compounds 11 are strongly jointed by chemical interaction and anchor effect caused by nanoscale asperities on a surface of the film 10, and further, since decrease of the joint strength due to moisture penetration is not so large, the epoxy molding compounds 11 and the metal leadframe 1 are not delaminated from each other even if the semiconductor device is exposed to harsh environment. As a result, compression stress by which the Si chip 5 is pushed to the metal leadframe 1 is constantly applied to the joint layer 4A in the bonding portion 14 by the contraction effect of the epoxy molding compounds 11, and therefore, occurrence of cracks such as openings in the joint layer 4A can be prevented even if shear strain caused by difference of thermal expansion between the Si chip 5 and the metal leadframe 1 is applied to the joint layer 4A. Accordingly, a very highly-reliable Pb-free semiconductor device can be provided.

Figure 3:
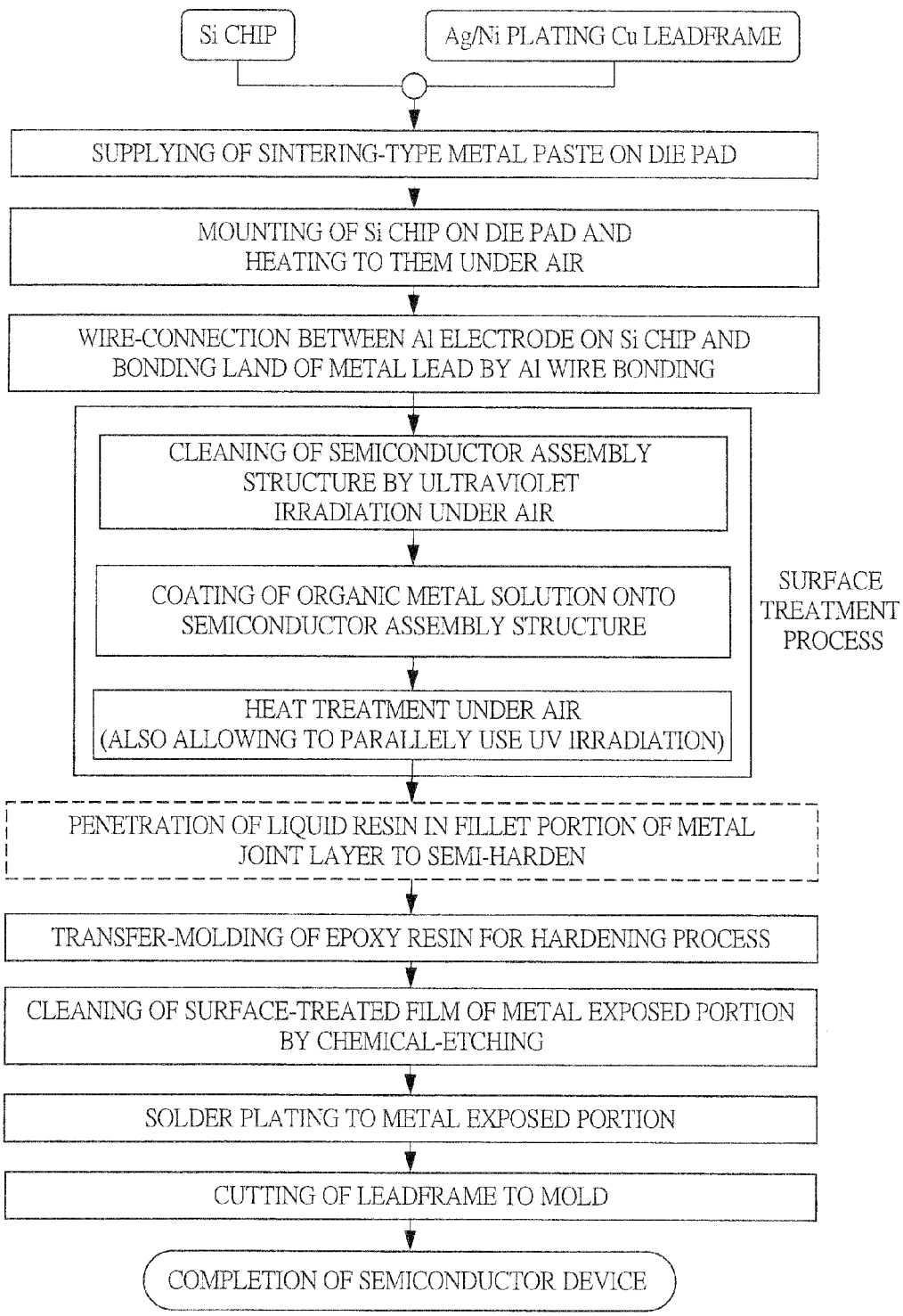
FIG. 3 is a flowchart illustrating a method of manufacturing the semiconductor device according to the first embodiment of the present invention.

Next, a method of manufacturing the semiconductor device according to the present embodiment will be described by using FIGS. 4 to 8 with reference to a flowchart in FIG. 3.

Figure 4:
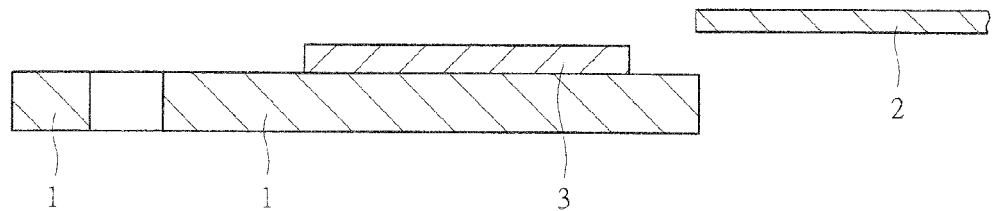
FIG. 4 is a cross-sectional view of a principal part describing the method of manufacturing the semiconductor device according to the first embodiment of the present invention.

First, as illustrated in FIG. 4, a metal leadframe 1 entirely plated with Ni (not illustrated), having the Ag-plating film 3 on a part of a chip-mounting surface, and mainly made of Cu (copper) and an external-extraction metal lead 2 combined with the metal leadframe 1 in a region not illustrated are prepared.

Figure 5:
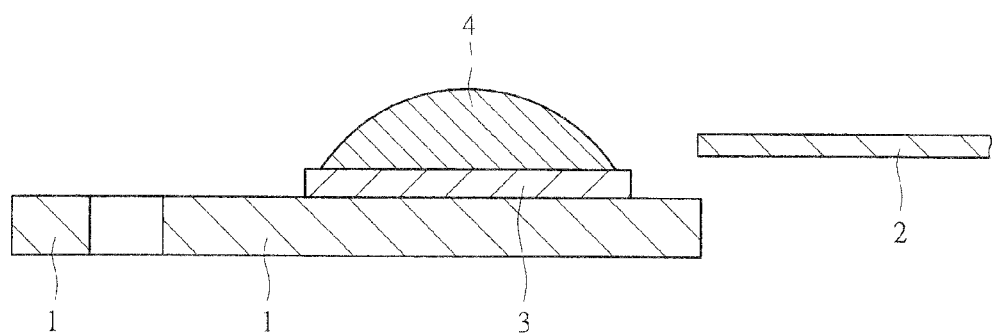
FIG. 5 is a cross-sectional view of a principal part of the semiconductor device in a manufacturing step continued from FIG. 4.

Next, as illustrated in FIG. 5, a metal paste 4 is supplied to the bonding portion 14 on the Ag-plating film 3, the metal paste 4 containing: Ag fine particles having a diameter of 1 μm or smaller; conductive particles made of Ag, Cu or the like having a diameter larger than 15 μm and smaller than 150 μm; and organic solution evaporated and disappearing under an oxidizing atmosphere at 300° C. or lower. A supplied amount of the metal paste 4 is controlled so that a thickness of the joint layer 4A after sintering becomes a target thickness.

Figure 6:
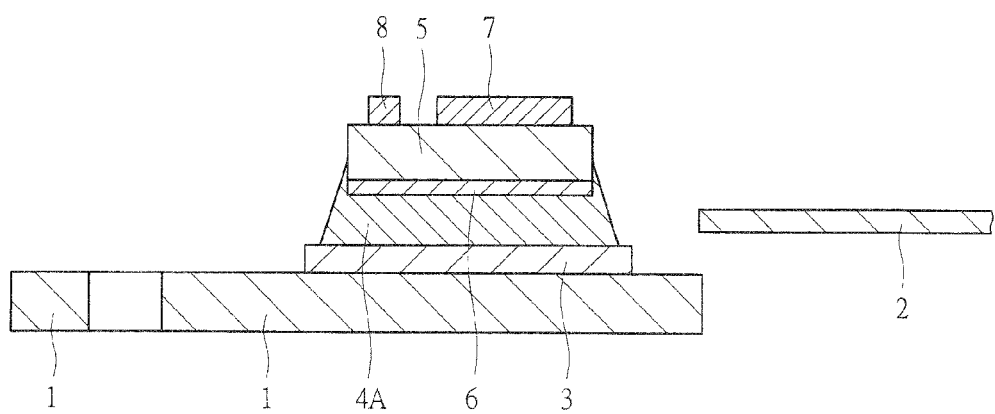
FIG. 6 is a cross-sectional view of a principal part of the semiconductor device in a manufacturing step continued from FIG. 5.

Next, as illustrated in FIG. 6, the Si chip 5 is mounted on the metal paste 4 by pushing the Si chip 5 with low pressure. And then, they are subjected to die-bonding in a furnace under an air atmosphere in the conditions, for example, at 250° C. for 60 minutes. The heating condition can be adjusted in a range of 150 to 350° C., and the higher the heating condition is, the shorter a treatment time is. However, if the heating temperature is high, the Ni-plating surface is oxidized to decrease the capability of an Al wire bonding, and therefore, the heating temperature is preferably 300° C. or lower. By this heating step, the metal paste 4 becomes the joint layer 4A.

Figure 7:
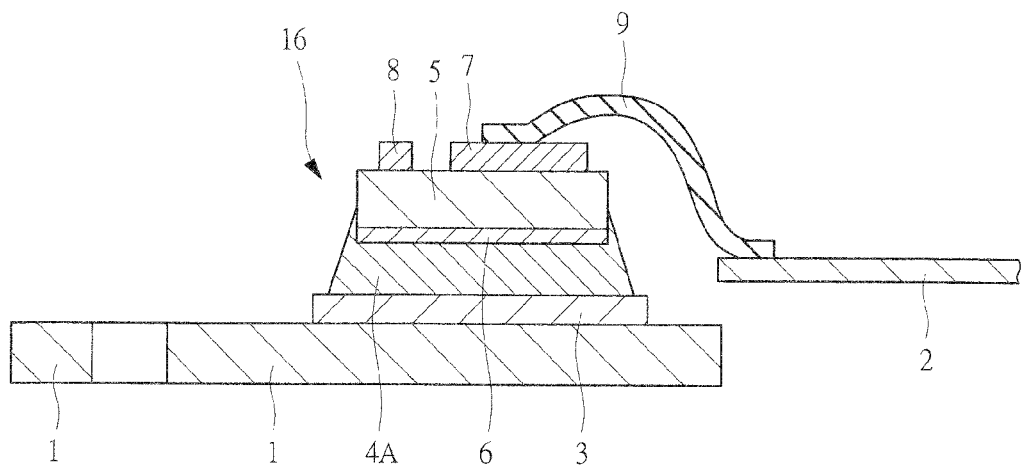
FIG. 7 is a cross-sectional view of a principal part of the semiconductor device in a manufacturing step continued from FIG. 6.

Next, as illustrated in FIG. 7, the main electrode 7 on the main surface of the Si chip 5 and the external-extraction metal lead 2 are electrically connected to each other by wedge bonding with using an Al wire 9. Also, the control electrode 8 and the control-electrode metal lead 2A are electrically connected to each other with using an Al wire 9A.

Figure 8:
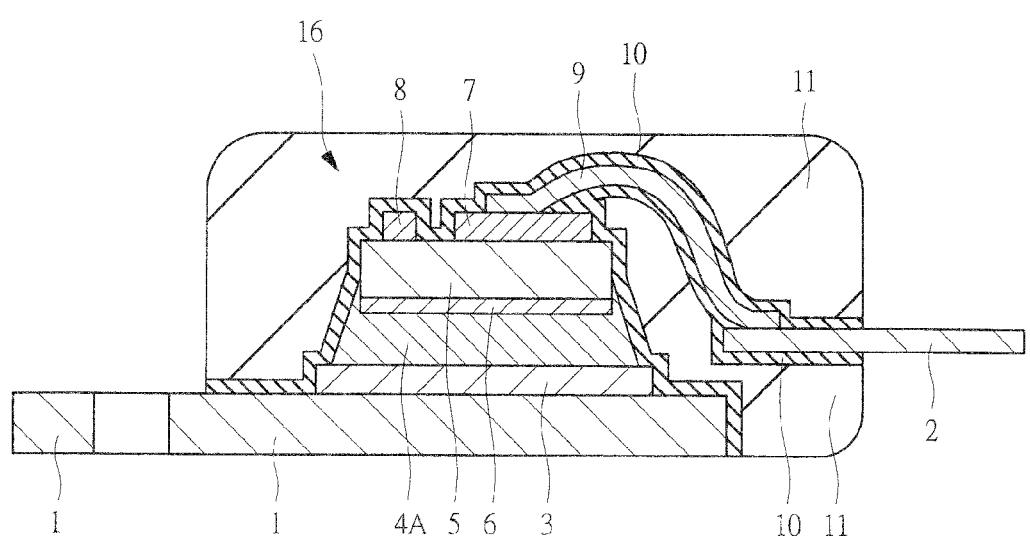
FIG. 8 is a cross-sectional view of a principal part of the semiconductor device in a manufacturing step continued from FIG. 7.

Next, as illustrated in FIG. 8, ultraviolet rays are irradiated to a top surface and side surfaces of a semiconductor assembly 16 to remove organic contaminations adsorbed on the surfaces, and then, organic metal compound solution diluted by organic solvent is coated to the surfaces. As a coating method, a dipping method or a spray method is suitable for the whole-surface coating, and a method of locally supplying the solution by an ink-jet method or a dispense method while heating the semiconductor assembly 16 at 100 to 150° C. is suitable for the selective coating. After coating the solution, the film 10 is formed by heating and sintering under the atmosphere at 200 to 350° C. Note that it is also possible to sinter at a low temperature of 150 to 300° C. by parallely using ultraviolet-ray irradiation.

Thereafter, a liquid epoxy resin is penetrated into the joint layer 4A in order to fill the epoxy resin in some voids inside the joint layer 4A, and heating and temporary-hardening are performed. And then, molding and hardening are performed by injection molding, so that the epoxy molding compound 11 is formed. Then, a sintered film attached on exposed metal portions is removed by light chemical etching, solder-plating (not illustrated) is performed, and the metal leadframe 1 and the external-extraction metal lead 2 are cut and shaped, so that the semiconductor device is completed.

Figure 9:
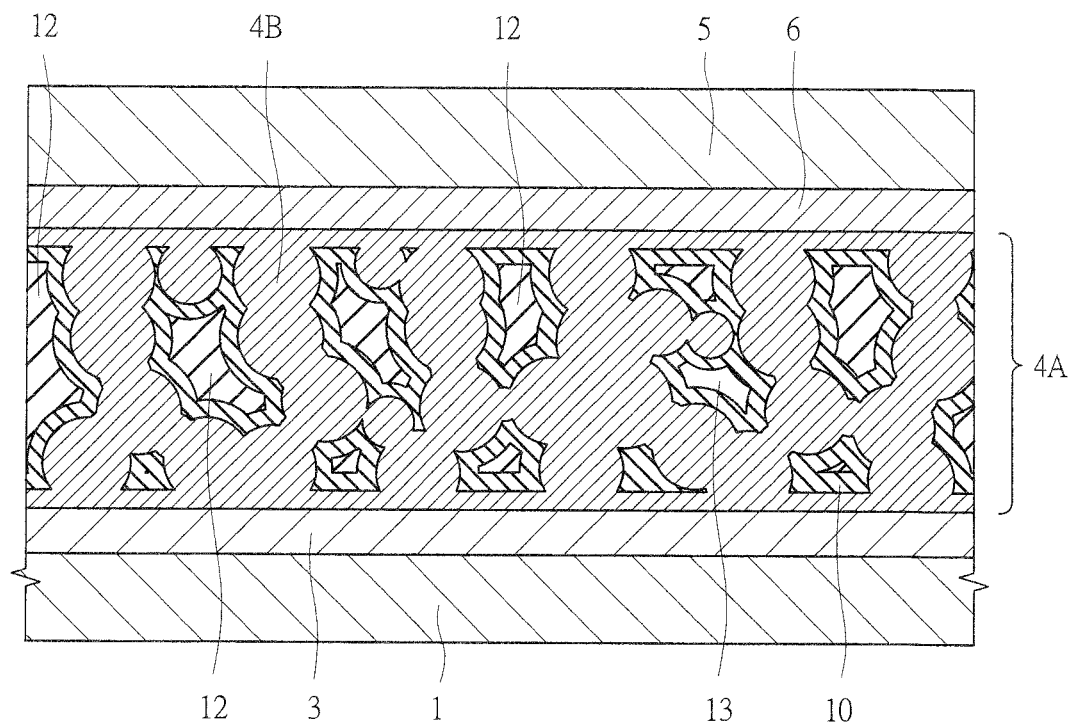
FIG. 9 is another cross-sectional view of a principal part illustrating the semiconductor device according to the first embodiment of the present invention.

Here, FIG. 9 illustrates a detailed structure diagram of the bonding portion 14 according to the present embodiment. In FIG. 9, the rear-surface electrode 6 made of a metal such as gold is formed on the rear surface of the Si chip 5, and the Ag-plating film 3 having a thickness of about 5 μm is formed on the chip-mounting surface of the metal leadframe 1 mainly made of Cu. The Si chip 5 and the metal leadframe 1 are jointed to each other by metallic bond via a metal framework 4B formed of porous Ag particles having a three-dimensional network structure. The joint state between the metal framework 4B and the rear-surface electrode 6 and between the metal framework 4B and the Ag-plating film 3 is achieved by Ag as a bonding material. In the metal framework 4B and on a surface of the rear-surface electrode 6 or the Ag-plating film 3, a film 10 containing ZnO and having a thickness of 1 to 600 nm is formed. A thermoset or thermoplastic polymer resin 12 is filled in a peripheral space in the metal framework 4B. Spaces closed by metals or spaces in which resins are difficult to flow from outside exist as voids 13.

In a method of manufacturing the die-bonding structure composed of the metal framework 4B, the films 10, the polymer resins 12, and the voids 13, first, a metal paste 4 in a paste state obtained by mixing and kneading Ag fine particles each having a diameter of 1 μm or smaller, Ag particles each having a diameter of 15 to 150 μm and a liquid organic material easily decomposed by oxidation is supplied between the metal leadframe 1 and the Si chip 5 and is subjected to heat treatment under an air atmosphere in a condition of no pressure at 200° C. or higher. The Ag fine particles have characteristics of being fused and combined with each other by the heat treatment at 200° C. or higher, and they form cross-linked structures by themselves or they function as adhesive paste for linking the Ag particles each having a relatively large size. Since a volume ratio occupied by the paste-like Ag is not so high, the metal framework 4B made of Ag and voids having a high volume ratio remain after the evaporation and disappearance of the liquid organic material. The porosity can be controlled by changing a filling density of the paste-like Ag.

Next, a solution obtained by diluting an organic Zn compound by organic solvent is coated and penetrated onto the joint layer 4A and is then heated under an air atmosphere at a temperature of 150 to 350° C. The organic solvent is evaporated and disappears at a relative low temperature, and the residual organic Zn compound is decomposed into Zn and organic ligands by pyrolysis. The Zn is attached and deposited on its peripheral metals, and the organic ligands are evaporated and disappear by oxidation. The deposited Zn reacts with oxygen to form ZnO. And then, the liquid polymer resin 12 is filled into the void portions in the joint layer 4A, and cross-link polymerization reactions of the polymer resin 12 are accelerated by the heat treatment to form a solid-like resin, so that the die-bonding structure in FIG. 9 is formed.

The formed oxide film 10 has a strong adhesion force partially bonded by metallic bond to the metal framework 4B being a base metal, and interfaces between the polymer resin 12 and the film 10 and between the epoxy molding compounds 11 and the film 10 are strongly bonded by the chemical reaction with functional groups of the organic resin. Furthermore, since the anchor effect can be obtained by nanoscale asperities on the surface of the film 10, the high joint strength can be obtained by the mechanical bonding. The strength of the oxide film 10 itself is higher than that of the resin, and as a result, the epoxy molding compounds 11 and the metal leadframe 1 are strongly jointed. In this manner, compression stress caused by resin shrinkage is constantly applied to the bonding portion 14 between the Si chip 5 and the metal leadframe 1 illustrated in FIG. 2, and therefore, local stress concentration is not caused at fillet portions 15 positioned at edge portions of the joint layer 4A outside the portion below the Si chip 5 in the thermal cycle test for the semiconductor device. Also, even if cyclic shear strain caused by difference of thermal expansion between the Si chip 5 and the metal leadframe 1 is applied to the joint layer 4A, cracks such as openings in the joint layer 4A are not caused, so that reliability of the semiconductor device can be significantly improved.

Here, as illustrated in FIG. 9, since the joint layer 4A has the structure bonded by Ag having high conductivity and high heat conduction, thermal resistance and electric resistance of the joint layer 4A can be made equal to or lower than those of the case of a conventional high Pb content solder even if a thickness of the joint layer 4A is as large as 200 µm, so that loss properties and heat radiation performance of the semiconductor device are not deteriorated. Also, since the porosity is as high as 20 to 70% to reduce the deformability, that is, yield stress of the joint layer 4A by low stress, a problem such that the Si chip 5 is cracked by thermal stress in cooling after the die-bonding can be prevented.

Also, since the thickness of the joint layer 4A is as large as 20 to 200 µm, thermal strain caused in the joint layer 4A by difference of thermal expansion between upper and lower members of the joint layer 4A can be reduced. Further, since the joint layer 4A has the porous structure in which the metal frameworks 4B are formed into the shape of three-dimensional network, thermal strain applied to the joint layer 4A can be absorbed by bending deformation of the thin-stick-like metal frameworks 4B, and therefore, plastic deformation of the metal frameworks 4B can be reduced, so that fatigue life of the joint layer 4A can be significantly improved. Accordingly, thermal fatigue life of the metal framework 4B in the joint layer 4A can be significantly extended, so that the reliability under thermal cycle test can be improved.

Note that, although heat and electricity pass through the joint layer 4A, the thickness of the joint layer 4A is 200 µm or smaller, and the components from the Si chip 5 to the metal leadframe 1 are bonded by the high conductive material. Therefore, electric resistance and heat resistance between them can be reduced to the level equal to or lower than that of the case of bonding by high Pb content solder, so that low loss and sufficient electric properties can be obtained as a semiconductor device. For example, in the case of the high Pb content solder, when its heat conductivity is 30 W/mK and its average solder thickness is 50 µm, the heat resistance per unit area of the joint layer 4A is $1.67 \times 10^{\times 5}$ K/W. Meanwhile, in the case of using Ag as the high conductive material, its heat conductivity is 420 W/mK when its porosity is 70% and its joint-layer thickness is largest, that is, 200 µm, and therefore, its heat resistance per unit area is $1.59 \times 10^{-5}$ K/W which is lower than that of the high Pb content solder.

Further, since the joint strength is significantly improved by filling the polymer resin 12 in voids in the joint layer 4A and forming the ZnO film 10 at the interface between the metal framework 4B and the polymer resin 12, the strength of the joint layer 4A can be improved and the high strength can be maintained for a long period even under severe environments. Therefore, thermal strain caused between the Si chip 5 and the metal leadframe 1 is shared by not only the joint layer 4A but also the Si chip 5 and the metal leadframe 1, and as a result, life of the joint layer 4A under thermal cycle test can be further improved, so that a highly reliable Pb-free semiconductor device can be provided without deteriorating the electric properties and heat radiation performance.

Note that the oxide film 10 formed on the surface of the metal framework 4B in the joint layer 4A is made of ZnO in the present embodiment. However, even if the oxide film 10 is formed of a Sn (tin) oxide film, a film mainly made of $Al_2O_3$, or others, the same effect can be obtained. These films mainly made of oxides of Zn, Al, or others can be formed as a film containing the metal oxide by coating an organic metal complex whose decomposition is accelerated at a temperature of 350° C. or lower on a metal surface and heating the organic metal complex under an oxidizing atmosphere at a temperature of 150 to 350° C. Acetylacetonate, 2-ethylhexanoic acid, neodecanoic acid, and others are known as typical ligands of the organic metal complex, and the sintered film thickness of as small as 1 to 600 nm can be achieved by the coating after the dilution with alcohol or the organic solvent of acetone or toluene. A reason why the heat temperature in the film formation can be increased up to 350° C. is that the bonding portion 14 is the joint layer formed by Ag-metallic bond and the bonding portion 14 has high heat resistance.

Also, since a manufacturing process of the semiconductor device of the present invention is the same as that of a conventional semiconductor device except that only the surface treatment process is a new process, conventional equipment can be used as a manufacturing line, so that equipment investment can be minimized.

Further, since the organic metal compound solution has only a risk as an organic solvent and does not contain toxic compounds, existing treatment equipment can be used in the light of safety or environment. Also, since coating and sintering process of the solution can be handled by simple equipment, there is an effect of suppressing a new equipment investment also from this point.

Still further, the filling of liquid resin into the joint layer 4A in the bonding portion 14 is not always necessary, and the filling can be cancelled because the epoxy molding compounds 11 of injection molding type are penetrated into outer portions of the joint layer 4A.

Still further, when the metal leadframe 1 is the one mainly formed of Cu-exposed surfaces and Ag is directly plated onto Cu, Cu oxidation is accelerated by heat treatment under an air atmosphere. Therefore, the heat temperature for the die-bonding is set to 250° C. or lower, reduction treatment of heating the metal leadframe under an atmosphere containing hydrogen is added, and heat treatment is performed under an atmosphere in which oxygen concentration is limited as a sintering atmosphere after coating the organic metal compound solution. The process temperature is set to be higher than that of the heat treatment under an air atmosphere and condition has to be changed for accelerating the decomposition of the organic metal compound.

Still further, although the structure bonded by the Ag porous joint layer 4A is used for the die bonding here, it is needless to say that the same effect can be obtained even in a semiconductor device using a conductive adhesive material of a resin adhesion type.

Still further, although the film 10 is formed on a whole resin-molding region of the semiconductor assembly 16, the same effect can be obtained even if the film 10 is formed on only the surfaces of the metal leadframe 1 and the joint layer 4A.

(Second Embodiment)

In the present embodiment, the present invention is applied to a method of manufacturing a semiconductor device, and the second embodiment will be described with reference to FIGS. 10 and 11.

Figure 10:
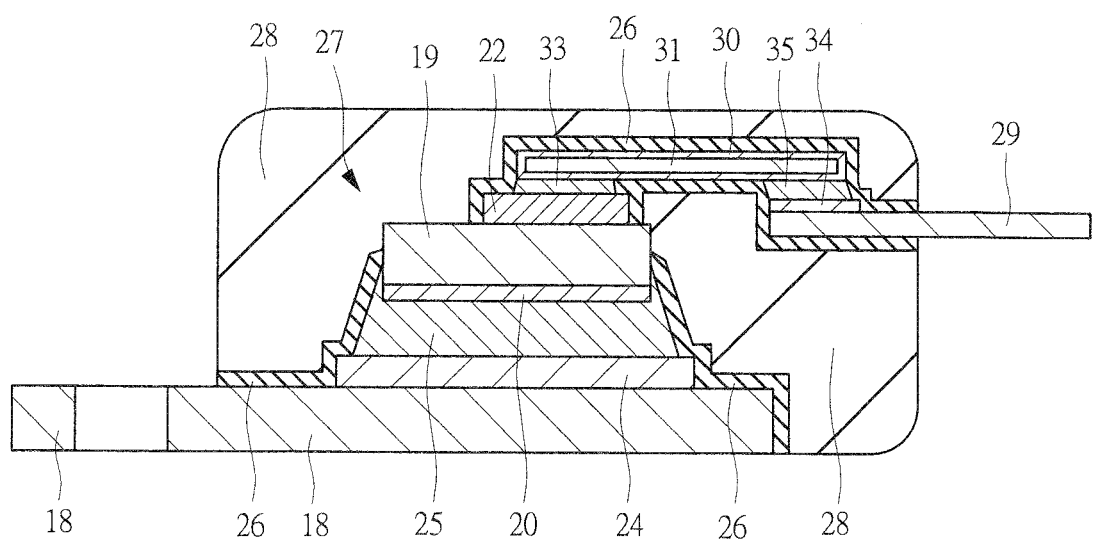
FIG. 10 is a cross-sectional view of a principal part illustrating a semiconductor device according to a second embodiment of the present invention.
Figure 11:
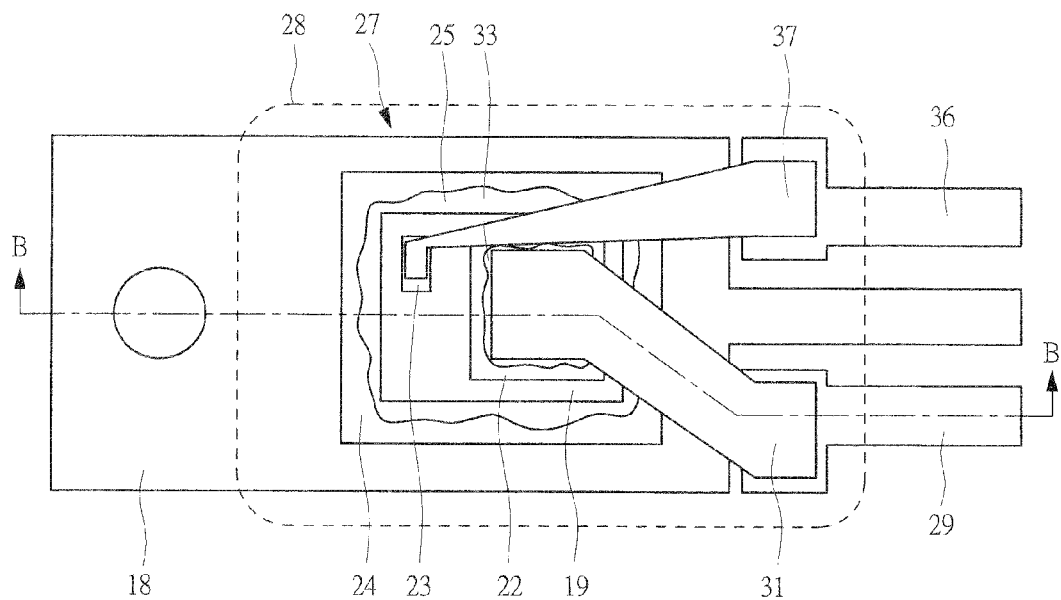
FIG. 11 is a plan view illustrating the semiconductor device according to the second embodiment of the present invention.

FIGS. 10 and 11 illustrate a structure of a semiconductor device according to the present embodiment. FIG. 10 illustrates a cross-sectional view taken along a line B-B in FIG. 11. FIG. 11 illustrates a top-surface plan view of the semiconductor device according to the present embodiment. Note that, in FIG. 11, epoxy molding compounds 28 in FIG. 10 are illustrated by a dotted line, and a film 26 and an Ag-plating film 30 are not illustrated.

In FIGS. 10 and 11, a rear-surface electrode 20 made of a metal such as gold is formed on a rear surface of a Si chip 19 which is a vertical semiconductor chip, and a main electrode 22 in which Ni/Au is formed on an Al film and a control electrode 23 are formed on a main surface of the Si chip 19. An Ag-plating film 24 is formed on a surface of a chip-mounting position of a metal leadframe 18, and the Si chip 19 is die-bonded onto the Ag-plating film 24 via an Ag porous joint layer 25 by metallic bond. A thickness of the joint layer 25 is 100 μm, and its porosity is 50%. A film 26 formed on a metal surface in the joint layer 25 is an oxide layer mainly made of ZnO and has a thickness of 20 to 300 nm, and the epoxy molding compounds 28 are filled in inside voids (not illustrated) in an outer vicinity of the joint layer 25, and voids (not illustrated) near a center of the joint layer 25 are cavities.

A main electrode 22 on the Si chip 19 and an external-extraction main-electrode metal lead 29 are connected to each other by a Cu-metal plate 31 on which an Ag-plating film 30 is formed. The metal plate 31 and the main electrode 22 are jointed to each other by metallic bond via an Ag porous joint layer 33, and the metal plate 31 and the main-electrode metal lead 29 are jointed to each other by metallic bond via an Ag porous joint layer 35 formed on an Ag-plating film 34 formed on the main-electrode metal lead 29.

The control electrode 23 and a control-electrode metal lead 36 are connected to each other by a Cu-metal plate 37. Thicknesses of the joint layers 33 and 35 on edge portions of the two metal plates 31 and 37 are 10 to 50 μm, and their porosities are 30 to 60%. A film (not illustrated) formed on a metal surface in the joint layer 33 is an oxide layer mainly made of ZnO and has a thickness of 20 to 300 nm, and the epoxy molding compounds 28 are filled in the inside voids in an outer vicinity of the joint layer 35. On a surface of a metal member of a semiconductor assembly 27 contacting to the epoxy molding compounds 28, the film 26 containing ZnO having a thickness in a range of 20 to 300 nm is formed. Here, by locally supplying an organic metal compound solution to be a material of the film 26 by an ink jet method, the film 26 is selectively formed on only a surface of a metal member except for the Si chip 19.

According to the present embodiment, the Si chip 19 is jointed to the metal leadframe 18 by the Ag porous joint layer 25, and the main electrode 22 and the main-electrode metal lead 29 are jointed to each other via the Cu-metal plate 31 by the Ag porous joint layers 33 and 35, respectively. Therefore, electric resistance in a mounting portion of a main current path can be decreased, so that power loss in the semiconductor device upon energization can be significantly reduced. At the same time, the joint layers 25, 33 and 35 are deformable by low stress because of the porous structures of the Ag joint layers 25, 33 and 35, so that thermal stress applied to the Si chip 19 is reduced to prevent the occurrence of chip cracks. Further, by two effects such as improvement of fatigue destroy life by the porous structures of the Ag joint layers 25, 33 and 35 and improvement of fatigue life by applying compression stress to the joint portion due to the adhesion enhancement of the epoxy molding compounds 28, reliability of the semiconductor device can be significantly improved. By the above-described effects, it is possible to provide a completely Pb-free and high-performance semiconductor device which is more reliable and can have a higher electric capacitance than the conventional one.

Note that, although each portion is jointed via the Ag porous layer in the present embodiment, it is also possible to provide a Pb-free highly-reliable semiconductor device by forming a mounting structure with using a resin-adhering Ag paste in order to improve the reliability by the high adhesion of the molding compounds.

(Third Embodiment)

In the present embodiment, the present invention is applied to a method of manufacturing a semiconductor device, and the third embodiment will be described with reference to FIG. 12.

Figure 12:
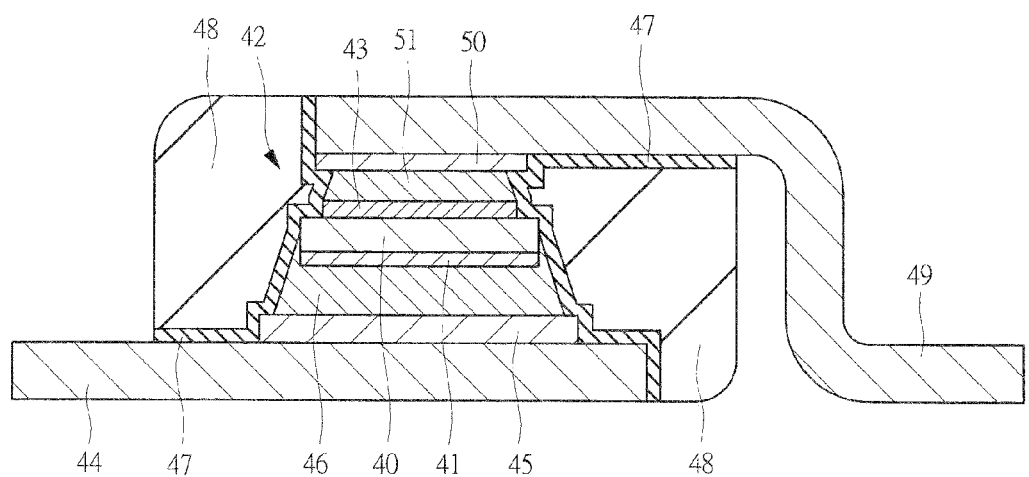
FIG. 12 is a cross-sectional view of a principal part illustrating a semiconductor device according to a third embodiment of the present invention.

FIG. 12 illustrates a structure of a semiconductor device according to the present embodiment. In FIG. 12, a rear-surface electrode 41 made of a metal such as gold is formed on a rear surface of a Si chip 40 which is a vertical semiconductor chip, an Al film (not illustrated) is formed on a main surface of the Si chip 40, and a main electrode 43 made of Ni/Au and a control electrode not illustrated are formed on the Al film. An Ag-plating film 45 is formed on a chip-mounting surface of a metal leadframe 44, and the Si chip 40 is die-bonded onto the Ag-plating film 45 via an Ag porous joint layer 46 by metallic bond. A thickness of the joint layer 46 is 150 μm, and its porosity is 50%. An oxide film 47 mainly made of ZnO having a thickness of 10 to 100 nm is formed on a metal surface in the joint layer 46, and the epoxy molding compounds 48 are filled in inside voids in an outer vicinity of the joint layer 46. An Ag-plating film 50 is formed at an electrode-connecting position of an external-extraction main-electrode metal lead 49, and the Ag-plating film 50 is jointed to the main electrode 43 via an Ag porous joint layer 51 by metallic bond. A control electrode and a control metal lead are also jointed to each other by the same structure although not illustrated. Each of the surfaces of the metal leads of the metal leadframe 44, the main-electrode metal lead 49, and the control metal lead opposite to the electrode-connecting surface is formed to have the structure exposed from the epoxy molding compounds 48. A film 47 containing ZnO having a thickness in a range of 20 to 300 nm is formed on a surface of a semiconductor assembly 42 contacting to the epoxy molding compounds 48.

According to the present embodiment, since the main electrode 43 and the main-electrode metal lead 49 on the Si chip 40 are directly jointed and surfaces opposite to the joint surface of these metal members are exposed to outside, electric resistance in the mounting portion can be minimized. Further, heat from the Si chip 40 can be dissipated by the upper metal members, and therefore, a semiconductor device having excellent cooling performance can be provided. In a mounting structure using high Pb content solder, life under thermal cycle test at a solder-jointed portion is short, and therefore, high reliability cannot be obtained. However, in the present embodiment, the life under thermal cycle test at the joint portion can be significantly improved by forming the structure of the joint portion via the Ag porous joint layers 46 and 51 by metallic bond and enhancing the adhesion by forming the oxide film 47 containing ZnO at the interface between the semiconductor assembly 42 and the epoxy molding compounds 48, and therefore, it is possible to provide a Pb-free semiconductor device having a required reliability, low loss, and high heat radiation performance.

In the foregoing, the invention made by the inventors has been concretely described based on the embodiments. However, it is needless to say that the present invention is not limited to the foregoing embodiments and various modifications and alterations can be made within the scope of the present invention.

Figure 13:
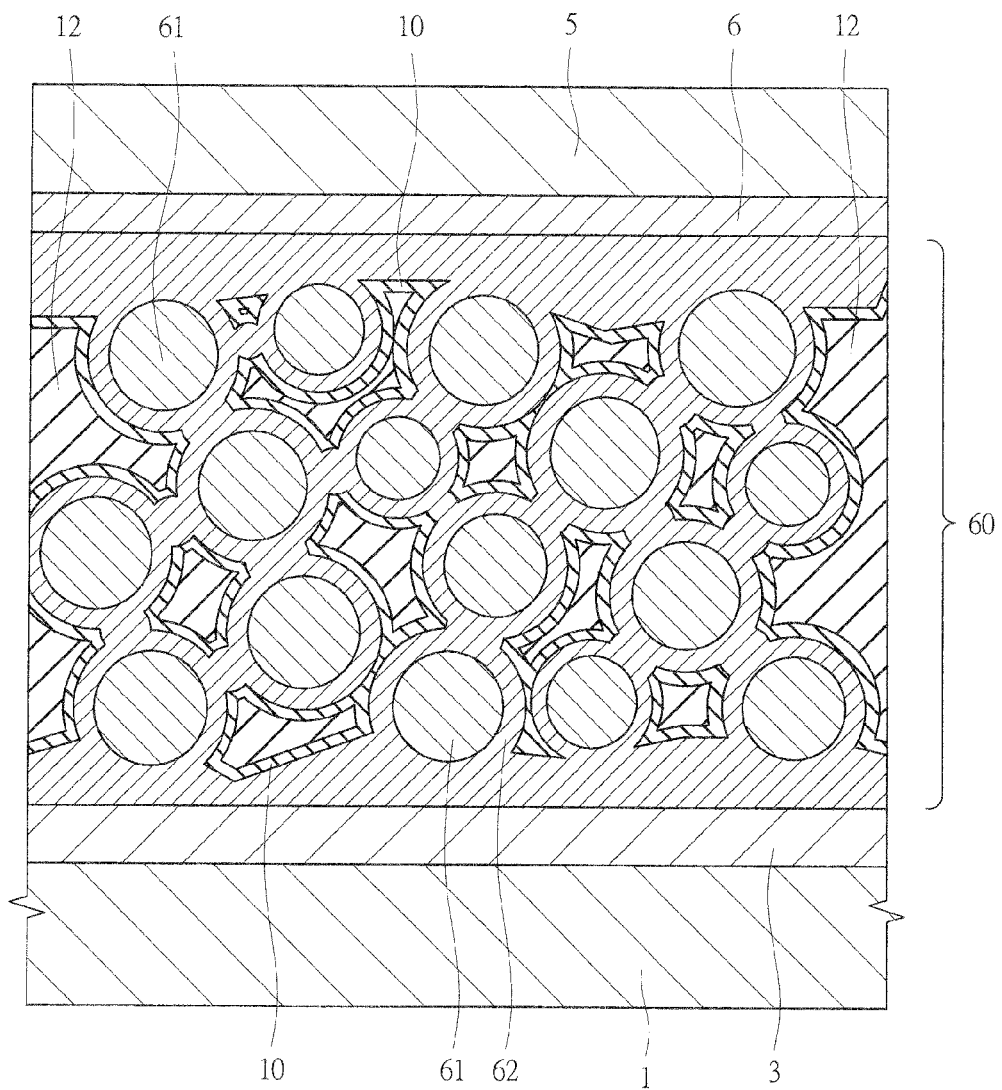
FIG. 13 is a cross-sectional view of a principal part illustrating a semiconductor device to which the present invention is applied.

For example, FIG. 13 illustrates a highly-reliable Pb-free die-bonding structure according to the present invention. In FIG. 13, a rear-surface electrode 6 made of a metal such as gold is formed on a rear surface of the Si chip 5, and an Ag-plating film 3 having a thickness of about 5 μm is formed on a chip-mounting surface of a metal leadframe 1 mainly made of Cu. A joint layer 60 has a structure in which Cu particles 61 are metallically jointed by an Ag sintering layer 62, and the Si chip 5 and the metal leadframe 1 are combined by metallic bond. A thickness of the joint layer 60 is controlled in a range of 20 to 100 μm, and a porosity of the joint layer 60 is controlled in a range of 20 to 70%. An $Al_2O_3$ film 10 having a thickness of 1 to 600 nm is formed on a metal surface of the joint layer 60, a polymer resin 12 subjected to hardening treatment is filled in spaces around the film 10, and spaces closed by metals or spaces in which resins are difficult to flow from outside exist as voids (not shown). Note that the Cu particles 61 may be made of other materials as long as they are Pb-free high conductive particles.

Here, since the die-bonding structure of the thick joint layer 60 in which a porous composition having a three-dimensional network structure is formed by the bonding of particles of high conductive materials of Cu and Ag is provided, it is possible to provide a semiconductor device having low ON resistance, excellent heat radiation performance, and excellent reliability under thermal cycle test. Also, since a polymer resin 12 of a thermoset resin is filled in voids of the porous composition in a state where the adhesion of the metal and the resin is enhanced and high strength is achieved, a ratio of thermal strain shared by the joint layer 60, the thermal strain being caused in upper and lower members of the joint layer 60, can be reduced. Also from this point, reliability under thermal cycle test can be improved.

A method of manufacturing a semiconductor device of the present invention is widely used for the manufacture of a semiconductor device having a Pb-free bonding structure using a vertical semiconductor chip.

What is claimed is:

1. A method of manufacturing a semiconductor device comprising a semiconductor assembly and insulating molding compounds, the semiconductor assembly comprising:
a metal leadframe having an external-extraction metal lead and a bonding portion;
a semiconductor chip die-bonded onto the bonding portion on the metal leadframe via a joint layer and having a rear-surface electrode; and
a joint member electrically connecting an electrode formed on a main surface of the semiconductor chip and the external-extraction metal lead,
the insulating molding compounds being formed so as to cover the semiconductor chip and a periphery of the semiconductor chip, and
the method comprising the steps of:
(a) die-bonding the semiconductor chip to the bonding portion on the metal leadframe by a conductive material containing Ag;
(b) electrically connecting the electrode on the main surface of the semiconductor chip and the external-extraction metal lead;
(c) after the step of (b), coating an organic metal compound solution on the semiconductor assembly;
(d) after the step of (c), heating the semiconductor assembly on which the organic metal compound solution is coated, thereby forming a metal oxide film on a surface of the semiconductor assembly by sintering; and
(e) molding the insulating molding compounds so as to cover at least a part of the semiconductor chip, the joint member, and the metal leadframe and then performing hardening treatment thereto, wherein
the die-bonding step in the step of (a) includes the steps of:
supplying, on the metal leadframe, the conductive material containing Ag made of Ag fine particles having a diameter of 1 μm or smaller, an organic material evaporated and disappearing under an oxidizing atmosphere at 300° C. or lower, and conductive metal particles each having a diameter larger than 15 μm and smaller than 150 μm;
mounting the semiconductor chip by pushing it from above the conductive material containing Ag; and
after the mounting step, heating the semiconductor assembly under an oxidizing atmosphere at a temperature of 150 to 300° C., thereby forming the joint layer.

2. The method of manufacturing the semiconductor device according to claim 1, wherein,
after the step of (a), a liquid resin is penetrated into fillet portions of the joint layer in the bonding portion and is semi-hardened.

3. The method of manufacturing the semiconductor device according to claim 1, wherein,
in the step of (a), the conductive material forming the joint layer in the bonding portion is formed by plating Ag on surfaces of particles mainly made of Cu.

4. The method of manufacturing the semiconductor device according to claim 1, wherein,
in the step of (d), the metal oxide film is mainly made of Zn oxide or Al oxide.

5. The method of manufacturing the semiconductor device according to claim 1, wherein, in the step of (a), a thickness of the joint layer in the bonding portion is 20 to 200 μm.

6. The method of manufacturing the semiconductor device according to claim 1, wherein,
after the step of (a), the electrode on the main surface of the semiconductor chip and the joint member or the joint member and the external-extraction metal lead are jointed by an Ag paste made of Ag particles and a thermoset resin.

7. The method of manufacturing the semiconductor device according to claim 1, wherein,
in the step of (a), the rear-surface electrode of the semiconductor chip and the metal leadframe are jointed to each other by conductive particles with using Ag as a bonding material, and a metal framework of the joint layer in the bonding portion has a three-dimensional network structure in which a volume ratio of a metal portion of the joint layer is 30 to 80%, and
in the step of (b), the electrode on the main surface of the semiconductor chip and the joint member or the joint member and the external-extraction metal lead are jointed by the joint layer containing conductive particles with using Ag as a bonding material, and a metal framework of the joint layer has a three-dimensional network structure in which a volume ratio of a metal portion of the joint layer is 30 to 80%.

8. The method of manufacturing the semiconductor device according to claim 1, wherein
the joint member is a bonding wire.

9. The method of manufacturing the semiconductor device according to claim 1, wherein
the joint member is a metal plate.

10. The method of manufacturing the semiconductor device according to claim 1, wherein
the joint member is an Ag paste made of Ag particles and a thermoset resin, and the electrode on the main surface of the semiconductor chip and the external-extraction metal lead are directly jointed to each other via the Ag paste.

* * * * *